United States Patent [19]
Tao

[11] Patent Number: 5,432,430
[45] Date of Patent: Jul. 11, 1995

[54] PHASE SHIFTING CIRCUIT AND METHOD FOR GENERATING SEVERAL OUTPUT SIGNALS OF DIFFERENT PHASES

[75] Inventor: Kung-Chung Tao, Hsingchu City, Taiwan

[73] Assignee: Industrial Technology Research Institute, Hsinchu, Taiwan

[21] Appl. No.: 163,132

[22] Filed: Dec. 7, 1993

[51] Int. Cl.⁶ .................................................. G05F 1/00
[52] U.S. Cl. ...................................... 323/217; 327/258
[58] Field of Search ....................... 323/212, 213, 217; 307/260, 262, 511, 512, 513

[56] References Cited

U.S. PATENT DOCUMENTS

| | | | |
|---|---|---|---|
| 4,137,507 | 1/1979 | Haramoto et al. | 330/302 |
| 4,255,701 | 3/1981 | Geller | 323/217 |
| 4,745,370 | 5/1988 | McGinn | 330/252 |
| 4,857,777 | 8/1989 | Altes | 307/511 |
| 5,148,062 | 9/1992 | Goldfarb | 307/511 |

FOREIGN PATENT DOCUMENTS

0299610  7/1988  Japan .......................... H03H 11/16

*Primary Examiner*—Thomas M. Dougherty
*Assistant Examiner*—Matthew V. Nguyen
*Attorney, Agent, or Firm*—Bo-In Lin

[57] ABSTRACT

The present invention discloses a phase shifting circuit for generating several output signals wherein each of the output signals maintaining a constant phase difference. The phase shifting circuit includes a first input port for receiving an input signal with a reference input phase. The phase shifting circuit further includes a second input port for receiving the input signal with a 180° from the reference input phase. The phase shifting circuit has a first branch connected between the first and second input ports, the first branch including a first resistor-capacitor (RC) segment connected in series via a first mid-point to a second resistor-capacitor (RC) segment wherein the second RC segment is configured, with reference to the first mid-point, in complete mirror symmetry relative to the first RC segment. The phase shifting circuit further includes a second branch connected between the first and second input ports in parallel to the first branch. The second branch includes a first resistor segment connected in series via a second mid-point to a second resistor segment wherein the second resistor segment is in total mirror symmetry relative to the first resistor segment with reference to the second mid-point. The phase shifting circuit has at least two output ports each connecting to the first RC segment and the second RC segment maintaining a constant phase difference between them. The first mid-point is connected to the second mid-point thus establishing a virtual ground potential for the phase shifting circuit wherein the virtual ground potential having a deflate voltage correlation with the input signal.

10 Claims, 2 Drawing Sheets

PHASE SHIFTING CIRCUIT AND METHOD FOR GENERATING SEVERAL OUTPUT SIGNALS OF DIFFERENT PHASES

BACKGROUND OF THE INVENTION

1. Field of the Invention

This invention relates generally to an apparatus and method for generating output signals of different phases. More particularly, this invention relates apparatus and method for generating quadrature signals in reference to a virtual ground to achieve total symmetry for these quadrature signals so generated.

2. Description of the Prior Art

As more portable personal communication systems are made available as a result of recent progress in the semiconductor technology and packaging engineering, one difficulty often encountered is to establish a virtual ground potential for such portable communication devices. As these communication devices often require broad bandwidth, the phase splitters which may be operated in the frequency ranges of more than few GHz are commonly utilized in such systems. The difficulty for the phase shifters to define a virtual ground position especially for application in portable communication systems presents a special problem for the design of such system when the signal process has to be performed without precise and stable reference voltage for reference as the ground voltage.

FIG. 1 shows a conventional phase splitter 10. The phase splitter 10 receives an input voltage $V_{in}$ through a field effect transistor (FET) $T_{in}$ which is connected in a source follower configuration to two branches of circuits wherein each of these branches forms a mutually inverted configurations of like valued elements including a resistor and a capacitor. A first branch is shown on the upper portion of the shifter 10 wherein the source of the FET $T_{in}$ is first connected to a capacitor $C_1$ and then to a resistor $R_1$ before it is connected to the ground. An output is derived from the output end of the capacitor $C_1$ for connecting to the gate of an output FET $T_o$. A second branch is shown in the bottom portion of the shifter 10 wherein the input line as connected from the source of the input FET $T_{in}$ is first connected in series to a resistor $R_2$ and then to a capacitor $C_2$ before it is connected to the ground. An output is derived from the output end of the resistor $R_2$ for connecting to the gate of an output FET $T_o'$. In arranging the phase shifter 10 by making $R_1$ equals to $R_2$ and $C_1$ to $C_2$, the output voltage as obtained from the source of the output FET $T_o'$ has a ninety degree phase difference with that of the output voltage of the FET $T_0$.

The conventional phase shifting circuit 10 presents two problems. First, as the output end of the capacitor $C_1$, i.e., point 12 is now brought to a ground potential via the resistor $R_1$ when there is no current flows through that branch of circuit. The direct current (DC) reference voltage for the in-phase output from the FET $T_o$ and that for the output from the out-of-phase output from the FET $T_o'$ cannot be consistently maintained at the same level. Secondly, for operation at high frequency, the ground potential for this phase shifter 10 is difficulty to measure and define, which makes it very inconvenient to utilize this shifter in a portable communication system. The situation is even worse when the shifting circuits are fabricated as integrated circuits (ICs) on an IC chip.

Altes discloses in U.S. Pat. No. 4,857,777 entitled "Monolithic Microwave Phase Shifting Network" (Issued on Aug. 15, 1989) a phase shifting network with multiple outputs. A constant phase difference is maintained between these outputs. The configuration of this network is a four-branch all-pass network. It has four similar all-pass networks. An in-phase and an out of phase input signals are applied to this network to generate four signals in phase quadrature of zero, ninety, one-hundred and eighty, and two hundred and seventy degrees. The phase shifter is intended for use with micro and millimeter wavelengths and may be realized from resistive and capacitive elements fabricated on a common monolithic substrate.

The phase shifting network as disclosed by Altes is able to eliminate the need of a reference ground potential for the RC networks. However, the quadrature shifting is accomplished via two RC branches that use resistors and capacitors of different values of resistances and capacitances in two branches. The circuits would be susceptible to fabrication variations due to these difference between the branches. The accuracy in fabricating the phase shifting circuit with controlled operation characteristics is therefore limited. Due to these limitations, it is difficult to design and manufacture the shifter for generating phase shift outputs with precisely controlled accuracy. Furthermore, application of this type of phase shifters to portable devices would be inconvenient and probably more expensive if additional circuit elements have to added for establishing and determining a stable and measurable virtual ground voltage.

Therefore, there is still a demand in the art of design and manufacture of phase shifting devices, particularly for portable devices for application to higher bandwidth ranges, an improved phase shifting apparatus and method to overcome this difficulty.

SUMMARY OF THE PRESENT INVENTION

It is therefore an object of the present invention to provide a method and circuit architecture for a phase shifting/splitting network such that aforementioned difficulties encountered in the prior art may be resolved.

Specifically, it is an object of the present invention to provide a method and circuit architecture for a phase shifting/splitting network wherein a stable virtual ground is established to provide constant reference for external interface.

Another object of the present invention is to provide a method and circuit architecture for a phase shifting/splitting network that a stable virtual ground is established by use of simple circuit elements which can be conveniently and economically implemented as part of the integrated circuit fabrication process.

Another object of the present invention is to provide a method and circuit architecture for a phase shifting/splitting network by the use of completely symmetrical circuit design such that it is simple to design and fabricate whereby the phase control network becomes more convenient and economical for broad implementation in portable communication systems.

Briefly, in a preferred embodiment, the present invention comprises a phase shifting circuit for generating several output signals wherein each of the output signals maintaining a constant phase difference. The phase shifting circuit comprises a first input port for receiving an input signal with a reference input phase. The phase shifting circuit further includes a second input port for receiving the input signal with a 180° from the reference input phase. The phase shifting circuit has a first branch connected between the first and second input ports, the first branch including a first resistor-capacitor (RC) segment connected in series via a first mid-point to a second resistor-capacitor (RC) segment wherein the second RC segment is configured, with reference to the first mid-point, in complete mirror symmetry relative to the first RC segment. The phase shifting circuit further includes a second branch connected between the first and second input ports in parallel to the first branch. The second branch includes a first resistor segment connected in series via a second mid-point to a second resistor segment wherein the second resistor segment is in total mirror symmetry relative to the first resistor segment with reference to the second mid-point.. The phase shifting circuit has at least two output ports each connecting to the first RC segment and the second RC segment maintaining a constant phase difference between them. The first mid-point is connected to the second mid-point thus establishing a virtual ground potential for the phase shifting circuit wherein the virtual ground potential having a definite voltage correlation with the input signal.

It is an advantage of the present invention that the it provides a method and circuit architecture for a phase shifting/splitting network such that aforementioned difficulty encountered in the prior art may be resolved.

Specifically, an advantage of the present invention is that it provides a method and circuit architecture for a phase shifting/splitting network wherein a stable virtual ground is established to provide constant reference for external interface.

Another advantage of the present invention is that it provides a method and circuit architecture for a phase shifting/splitting network that a stable virtual ground is established by use of simple circuit elements which can be conveniently and economically implemented as part of the integrated circuit fabrication process.

Another advantage of the present invention is that it provides a method and circuit architecture for a phase shifting/splitting network by the use of completely symmetrical circuit design such that it is simple to design and fabricate whereby the phase control network becomes more convenient and economical for broad implementation in portable communication systems.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 2:
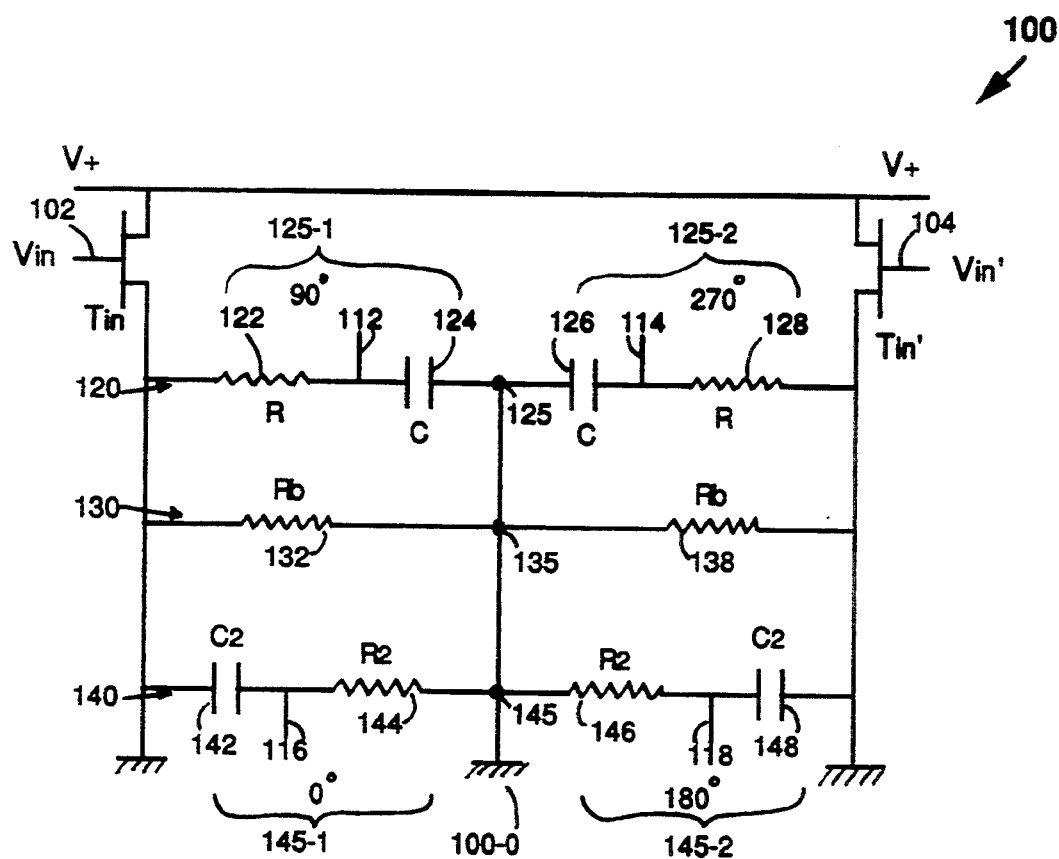
FIG. 2 is a schematic circuit diagram of a quadrature signal generating apparatus according to the present invention.

A preferred embodiment of the present invention is shown in FIG. 2 wherein a simplified circuit diagram of a phase shifting circuit 100 is shown. The phase shifting circuit 100 has two input ports 102 and 104 to accept two input signals which are of substantially equal amplitudes and are opposite in phase, i.e., differ in phase by 180°. The phase shifting circuit 100 generates at four output ports, i.e., ports 112, 114, 116 and 118 four signals which of substantial equal amplitude and each has a phase which differs from the phase of a next signal by 90° while one of the output signal may have the same phase or may have a certain phase shift relative to one of the input signals depending on the circuit design of the phase shifting circuit 100 and its application. Therefore, four output signals are generated with a quadrature relationship wherein the phase for each these signals being shifted by 90°, 180°, and 270° from one of these output signals.

The input ports 102 and 104 of the phase shifting circuit 100 are two field effect transistors (FETs) $T_{in}$ and $T_{in}'$ which are connected in a source follower configuration. The input ports 102 and 104 are employed to match the impedance between a prior driven circuit (not shown) and the circuit elements of the phase shifting circuit 100 for which the details will be described below. The drains of the FET transistors $T_{in}$ and $T_{in}'$ are connected to a constant positive direct current (DC) voltage $V_+$. The input signals $V_{in}$ and $-V_{in}$ are applied to the gate of the FET transistor 102 and 104 respectively.

Connected in parallel between the source of the transistor $T_{in}$ and the source of the transistor $T_{in}'$ are three circuit branches. Each of these three parallel branches includes circuit elements forming a mirror symmetric configuration with respect to a mid-point of that branch. Specifically, a first parallel connected branch 120 comprises a resistor 122 with a resistance of R connected in series to a capacitor 124 with a capacitance of C forming a first RC circuit 125-1. This first RC circuit 125-1 is connected in series to a second RC circuit 125-2 which is mirror symmetrical to the first RC circuit 125-1. Thus the first RC circuit is connected in series via a mid-point 125 to a capacitor 126 with a capacitance of C then to a resistor 128 with a resistance of R wherein the capacitor 126 and the resistor 128 forms the second RC circuit 125-2 which is in mirror symmetry with the first RC circuit.

A second parallel branch 130 includes two resistors 132 and 138 connected in series via a mid point 135. Again, since resistors 132 and 138 have equal resistance of $R_b$, the resistors 132 and 138 form a mirror symmetrical circuit with respect to the mid-point 135.

A third parallel branch 140 comprises a capacitor 142 with a capacitance of $C_2$ connected in series to a resistor 144 with a resistance of $R_2$ forming a first RC circuit 145-1. This first RC circuit 145-1 is connected in series to a second RC circuit 145-2 which is mirror symmetrical to the first RC circuit 145-1. Thus the first RC circuit is connected in series via a mid-point 145 to a resistor 146 with a resistance of $R_2$ then to a capacitor 148 with a capacitance of $C_2$ wherein the capacitor 148 and the resistor 146 forms the second RC circuit 145-2 which is in mirror symmetry with the first RC circuit 145-1.

Figure 1:
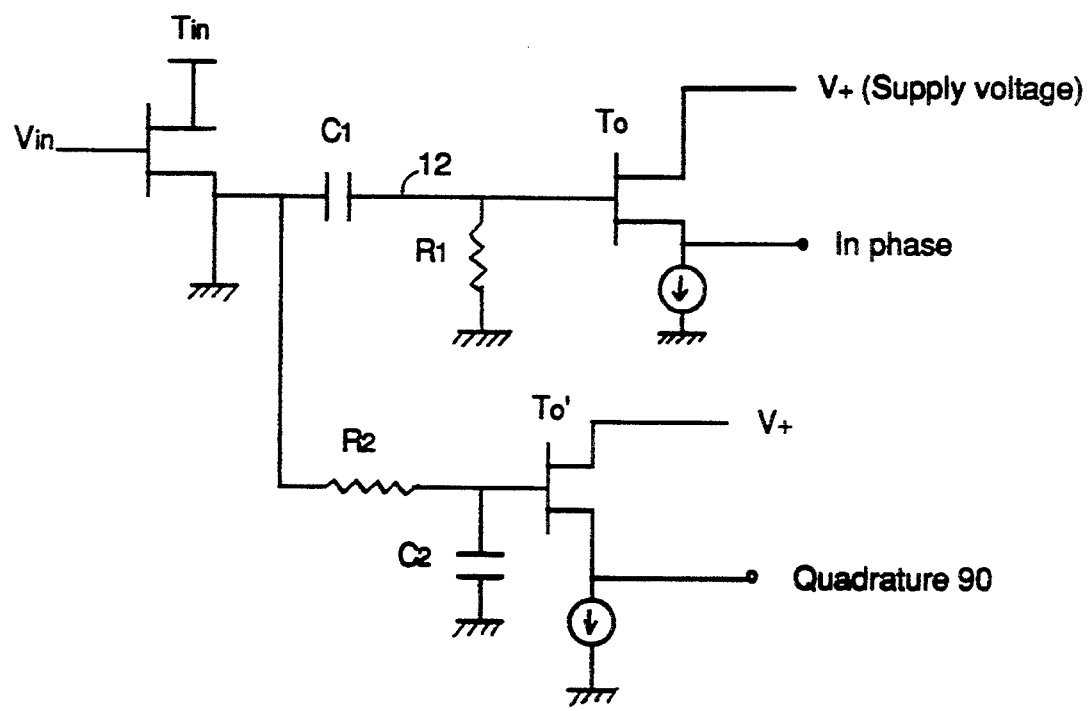
FIG. 1 is a schematic circuit diagram of a prior art phase shifting network.

The mid-points, i.e., mid-points 125-0, 135, and 135-0, are further inter-connected and then connected to a ground potential to form a virtual ground point 100-0. Because of the mirror symmetry of these three branches, a virtual ground, i.e., an AC ground, is established in the mid-points 125-0, 135, and 145-0. The first and the third RC branches 120 and 140 function in a similar manner as the phase shifting circuit as shown in FIG. 1. The second branch 130 is used to establish the direct current, i.e., DC, level of the virtual ground point in the branch 140 which is blocked by the series capacitors 142 and 148.

The phase shifting circuit 100 also includes four output lines. These four output lines are (1). output line 112 connected to a point between the resistor 122 and the capacitor 124, (2) output line 114 connected to a point between the capacitor 126 and the resistor 128, (3) output line 116 connected to a point between the capacitor 142 and the resistor 144, and (4) output line 118 connected to a point between the resistor 146 and the capacitor 148. These four output lines, i.e., output lines 123, 127, 143, and 147 provide output signals with phase differences of 90°, 270°, 0°, and 180° respectively from each of the output signals. The phase shifting circuit 100 thus generates four output signals in phase quadrature from four output lines 123, 127, 143, and 147.

Because of the mirror symmetry of the circuit elements in all three parallel branches, i.e., branches 120, 130 and 140, the interconnected mid-points, i.e., mid-points 125-0, 135, and 145-0 form a stable virtual ground point 100-0. The mid-point 125-0 on the first branch is constantly maintained at a ground potential because the voltage across the first RC-circuit 125-1 always equals to the voltage across the second RC-circuit 125-2 and of opposite phase. The voltage across the first RC-circuit 125-1 thus cancels out the voltage across the second RC-circuit 125-2 at the mid-point 125-0. A stable virtual ground voltage is therefore generated at the mid point 125-0 which has a controllable relative potential difference with the positive direct current (DC) voltage $V_+$ via the resistors 132 and 138. Also the voltage across the resistor 132 is of the same amplitude and has a phase difference of 180° from that of the voltage across the resistor 138. The voltage across the resistor 132 cancels out the voltage across the resistor 138 at the mid point 135. A stable virtual ground potential is also generated at the mid point 135.

Similarly, on the third parallel branch 140, the mid-point 145-0 is constantly maintained at a ground potential because the voltage across the first RC-circuit 145-1 always equals to the voltage across the second RC-circuit 145-2 and of opposite phase. The voltage across the first RC-circuit 145-1 thus cancels out the voltage across the second RC-circuit 145-2 at the mid-point 145-0. A stable virtual ground voltage is therefore generated at the mid point 125-0 which also has a controllable relative potential difference with the positive direct current (DC) voltage $V_+$ via the resistors 132 and 138.

According to the above description, this invention discloses a phase shifting circuit 100 for generating several output signals wherein each of the output signals maintaining a constant phase difference, the phase shifting circuit 100 comprises a first input port 102 which includes a first FET for applying an input signal $V_{in}$ with a reference input phase to the gate of the FET. The phase shifting circuit further includes a second input port 104 which includes a second FET for applying the input signal $-V_{in}$ with a 180° from the reference input phase to the gate of the second FET. The drains of the first and second FETs are connected to a positive direct current (DC) voltage $V_+$. A first branch 120 is connected between the sources of the first and second FETs, the first branch 120 includes a first resistor-capacitor (RC) segment 125-1 connected in series via a first mid-point 125 to a second resistor-capacitor (RC) segment 125-2 wherein the first RC segment 125-1 including a first resistor 122 and first capacitor 124 and the second RC segment 125-2 includes an identical resistor 128 and capacitor 126 and being configured, with reference to the first mid-point 125, in complete mirror symmetry relative to the first RC segment 125-1. A second branch 130 connected between the first and second input ports in parallel to the first branch 120. The second branch 120 includes a first resistor segment 132 connected in series via a second mid-point 135 to a second resistor segment 138 wherein the second resistor segment 138 being in total mirror symmetry relative to the first resistor segment 132 with reference to the second mid-point 135. A third branch 140 is connected between the sources of the first and second FETs. The third branch 140 includes a third resistor-capacitor (RC) segment 145-1 connected in series via a third mid-point 145 to a fourth resistor-capacitor (RC) segment 145-2 wherein the third RC segment 145-1 includes a second resistor 144 and second capacitor 142 and the fourth RC segment 145-2 include an identical second resistor 146 and second capacitor 148 and being configured, with reference to the third mid-point 145, in complete mirror symmetry relative to the third RC segment 145-1. The second resistor 144 or 146 and second capacitor 142 or 148 in the third and fourth RC segments 145-1 and 145-2 being further arranged in reverse order from that of the first and second RC segments 125-1 and 125-2. Four output ports, i.e. the output ports 112, 114, 116 and 118, each connecting between the resistor and capacitor in each of the RC segment for maintaining a quadrature phase relation among the four output ports. The first mid-point 125 and third mid-point 145 are connected to the second mid-point 135 thus establishing a virtual ground potential for the phase shifting circuit 100 wherein the virtual ground potential having a definite voltage correlation with the input signal $V_{in}$. Each of the branches, i.e., the branches 120, 130 and 140, may be all pass network for maintaining a constant amplitude transfer characteristic over a band of frequency for the input signals. Furthermore, the phase shifting circuit 100 may be fabricated on a monolithic substrate by utilizing integrated circuit (IC) processing steps suitable for forming the FETs, resistors, capacitors therein. In one of a preferred embodiments, for the purpose of allowing high frequency operation, the substrate is a gallium arsenide substrate.

This invention also discloses a method for generating several output signals wherein each of said output signals maintaining a constant phase difference. This method comprises the steps of: (a) applying an input signal with a reference input phase to a first input port 102 and applying the input signal with a 180° from the reference input phase to a second input port 104; (b) connecting a first branch 120 between the first and second input ports, i.e., 102 and 104, the first branch 120 including a first resistor-capacitor (RC) segment 125-1 connected in series via a first mid-point 125 to a second resistor-capacitor (RC) segment 125-2 wherein the second RC segment 125-2 being configured, with reference to the first mid-point 125, in complete mirror symmetry relative to the first RC segment 125-1; (c) connecting a second branch 130 between the first and second input ports, i.e., 102 and 104, in parallel to the first branch 120, the second branch 130 including a first resistor segment 142 connected in series via a second mid-point 135 to a second resistor segment 138 wherein the second resistor segment 138 being in total mirror symmetry relative to the first resistor segment 132 with reference to the second mid-point 135; (d) connecting the first mid-point 125 to the second mid-point 135 thus establishing a virtual ground potential for the phase shifting circuit wherein the virtual ground potential having a definite voltage correlation with the input signal; and (e) generating an output signal from each output port, i.e., output ports 112 and 114, wherein each of the output ports 112 and 114 being connected to the first RC segment 125-1 and the second RC segment 125-2 respectively whereby the output signals maintaining a constant phase difference between each other.

The present invention thus provides a method and circuit architecture for design and manufacturing a phase shifting/splitting network which is able to overcome the difficulties encountered in the prior art. Specifically, the circuit architecture establishes a stable virtual ground which provides a constant AC ground reference for external interface. The phase shifting network is configured by the use of simple circuit elements which can be conveniently and economically implemented as part of the integrated circuit fabrication process. Furthermore, the circuit architecture for the phase shifting/splitting network is configured by the use of completely symmetrical circuit design such that it is simple to design and fabricate whereby the phase control network becomes more convenient and economical for broad implementation in portable communication systems.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A phase shifting circuit for generating several output signals wherein each of said output signals maintaining a constant phase difference, said phase shifting circuit comprising:
   a first input port for receiving an input signal with a reference input phase;
   a second input port for receiving said input signal with a 180° from said reference input phase;
   a first branch connected between said first and second input ports, said first branch including a first resistor-capacitor (RC) segment connected in series via a first mid-point to a second resistor-capacitor (RC) segment wherein said second RC segment being configured, with reference to said first mid-point, in complete mirror symmetry relative to said first RC segment;
   a second branch connected between said first and second input ports in parallel to said first branch, said second branch including a first resistor segment connected in series via a second mid-point to a second resistor segment wherein said second resistor segment being in total mirror symmetry relative to said first resistor segment with reference to said second mid-point;
   at least two output ports each connecting to said first RC segment and said second RC segment maintaining a constant phase difference between them; and
   said first mid-point being connected to said second mid-point thus establishing a virtual ground potential for said phase shifting circuit wherein said virtual ground potential having a definite voltage correlation with said input signal.

2. The phase shifting circuit of claim 1 wherein:
   each of said first and second RC segments includes a capacitor and a resistor wherein one of said output ports is connected between said capacitor and said resistor in said first RC segment and another of said output ports is connected between said resistor and said capacitor in said second RC segment whereby said first and second output ports maintain a 180° phase difference.

3. The phase shifting circuit of claim 1 wherein:
   each of said first and second input ports is a field effect transistor (FET) wherein the drain of said FETs being connected to a positive direct current (DC) voltage, said input signals being applied to the gate of said FETs and said first and second branches being connected as source follower circuits.

4. The phase shifting circuit of claim 1 further comprises:
   a third branch connected between said first and second input ports in parallel to said first and second branches, said third branch including a third resistor-capacitor (RC) segment connected in series via a third mid-point to a fourth resistor-capacitor (RC) segment wherein said fourth RC segment being configured, with reference to said third mid-point, in complete mirror symmetry relative to said third RC segment;
   said third and fourth RC segments include several resistor and capacitor elements which being configured in reverse order relative to said first and second RC segment of said first branch;
   at least two output ports each connecting to said third RC segment and said fourth RC segment each of said output ports maintaining a constant phase difference between them; and
   said third mid-point being connected to said first and second mid-points thus establishing a virtual ground potential for said third branch.

5. The phase shifting circuit of claim 4 wherein:
   each of said third and fourth RC segments includes a capacitor and a resistor wherein one of said output ports is connected between said capacitor and said resistor in said third RC segment and another of said output ports is connected between said resistor and said capacitor in said fourth RC segment whereby said output ports connecting to said first, second, third and fourth RC segments maintaining a quadrature phase relation.

6. A phase shifting circuit for generating several output signals wherein each of said output signals maintaining a constant phase difference, said phase shifting circuit comprising:
   a first input port including a first FET for applying an input signal with a reference input phase to the gate of said FET;
   a second input port including a second FET for applying said input signal with a 180° from said reference input phase to the gate of said second FET;
   the drain of said first and second FETs being connected to a positive direct current (DC) voltage;
   a first branch connected between the sources of said first and second FETs, said first branch including a first resistor-capacitor (RC) segment connected in series via a first mid-point to a second resistor-capacitor (RC) segment wherein said first RC segment including a first resistor and a first capacitor and said second RC segment include an identical resistor and capacitor and being configured, with reference to said first mid-point, in complete mirror symmetry relative to said first RC segment;

a second branch connected between said first and second input ports in parallel to said first branch, said second branch including a first resistor segment connected in series via a second mid-point to a second resistor segment wherein said second resistor segment being in total mirror symmetry relative to said first resistor segment with reference to said second mid-point;

a third branch connected between the sources of said first and second FETs, said third branch including a third resistor-capacitor (RC) segment connected in series via a third mid-point to a fourth resistor-capacitor (RC) segment wherein said third RC segment including a second resistor and a second capacitor and said fourth RC segment include an identical second resistor and second capacitor and being configured, with reference to said first mid-point, in complete mirror symmetry relative to said third RC segment;

said second resistor and said second capacitor in said third and fourth RC segments being further arranged in reverse order from that of the first and second RC segments;

four output ports each connecting between said resistor and capacitor in each of said RC segment for maintaining a quadrature phase relation among said four output ports; and said first mid-point and third mid-point being connected to said second mid-point thus establishing a virtual ground potential for said phase shifting circuit wherein said virtual ground potential having a definite voltage correlation with said input signal.

7. The phase shifting circuit of claim 6 wherein:
each of said branches are all pass network for maintaining a constant amplitude transfer characteristic over a band of frequency for said input signals.

8. The phase shifting circuit of claim 7 wherein:
said phase shifting circuit is fabricated on a monolithic substrate by utilizing integrated circuit (IC) processing steps suitable for forming said FETs, said resistors, said capacitors therein.

9. The phase shifting circuit of claim 8 wherein:
said substrate is a gallium arsenide substrate.

10. A method for generating several output signals wherein each of said output signals maintaining a constant phase difference, said method comprising the steps of:

(a) applying an input signal with a reference input phase to a first input port and applying said input signal with a 180° from said reference input phase to a second input port;

(b) connecting a first branch between said first and second input ports, said first branch including a first resistor capacitor (RC) segment connected in series via a first mid-point to a second resistor-capacitor (RC) segment wherein said second RC segment being configured, with reference to said first mid-point, in complete mirror symmetry relative to said first RC segment;

(c) connecting a second branch between said first and second input ports in parallel to said first branch, said second branch including a first resistor segment connected in series via a second mid-point to a second resistor segment wherein said second resistor segment being in total mirror symmetry relative to said first resistor segment with reference to said second mid-point;

(d) connecting said first mid-point to said second mid-point thus establishing a virtual ground potential for said phase shifting circuit wherein said virtual ground potential having a definite voltage correlation with said input signal; and (e) generating an output signal from each output port wherein each of said output ports being connected to said first RC segment and said second RC segment whereby said output signals maintaining a constant phase difference between each other.

* * * * *